US012006384B2

(12) United States Patent
Ku et al.

(10) Patent No.: US 12,006,384 B2
(45) Date of Patent: Jun. 11, 2024

(54) RANDOM COPOLYMER AND PINNING COMPOSITION COMPRISING THE SAME

(71) Applicant: LG Chem, Ltd., Seoul (KR)

(72) Inventors: Se Jin Ku, Daejeon (KR); Mi Sook Lee, Daejeon (KR); Na Na Kang, Daejeon (KR); Eung Chang Lee, Daejeon (KR); Sung Soo Yoon, Daejeon (KR); No Jin Park, Daejeon (KR); Je Gwon Lee, Daejeon (KR); Eun Young Choi, Daejeon (KR); Hyung Ju Ryu, Daejeon (KR); Yoon Hyung Hur, Daejeon (KR)

(73) Assignee: LG Chem, Ltd., Seoul (KR)

( * ) Notice: Subject to any disclaimer, the term of this patent is extended or adjusted under 35 U.S.C. 154(b) by 774 days.

(21) Appl. No.: 16/652,565

(22) PCT Filed: Oct. 29, 2018

(86) PCT No.: PCT/KR2018/012891
§ 371 (c)(1),
(2) Date: Mar. 31, 2020

(87) PCT Pub. No.: WO2019/083337
PCT Pub. Date: May 2, 2019

(65) Prior Publication Data
US 2020/0239701 A1    Jul. 30, 2020

(30) Foreign Application Priority Data
Oct. 27, 2017    (KR) .................... 10-2017-0141006

(51) Int. Cl.
*C08F 230/02*    (2006.01)
*C08F 212/14*    (2006.01)
(Continued)

(52) U.S. Cl.
CPC ........ *C08F 212/20* (2020.02); *C08F 220/301* (2020.02); *C08F 220/44* (2013.01);
(Continued)

(58) Field of Classification Search
None
See application file for complete search history.

(56) References Cited

U.S. PATENT DOCUMENTS 5,176,975 A * 1/1993 Kato ...................... G03G 13/28
430/49.6
5,624,777 A * 4/1997 Kato .................... G03G 5/0589
430/49.6
(Continued)

FOREIGN PATENT DOCUMENTS

CA    2024482 A  *  3/1991  .......... G03F 7/0233
CN   107118313 A  *  9/2017  .......... C08F 290/061
(Continued)

OTHER PUBLICATIONS

International Search Report for Application No. PCT/KR2018/012891, mailed Jan. 18, 2019, pp. 1-2.
(Continued)

*Primary Examiner* — Sanza L. McClendon
(74) *Attorney, Agent, or Firm* — Lerner David LLP

(57) ABSTRACT

The present application relates to a pinning composition, a laminate comprising the same, and a method for producing the same. The pinning composition of the present application can impart directionality and location selection properties to a polymer membrane comprising a self-assembly structure of a block copolymer. The pinning composition of the present application exhibits excellent reaction selectivity, whereby it can form a vertical lamella structure with a high degree of alignment. In addition, the pinning compo-
(Continued)

sition of the present application may be suitable for application to low temperature processes.

20 Claims, 3 Drawing Sheets

(51) Int. Cl.
*C08F 220/30* (2006.01)
*C08F 220/44* (2006.01)
*C08F 293/00* (2006.01)
*C09D 5/00* (2006.01)
*C09D 133/20* (2006.01)
*C09D 153/00* (2006.01)
*H01L 21/027* (2006.01)
*C08F 220/32* (2006.01)

(52) U.S. Cl.
CPC .......... *C08F 293/005* (2013.01); *C09D 5/002* (2013.01); *C09D 133/20* (2013.01); *C09D 153/00* (2013.01); *H01L 21/0271* (2013.01); *C08F 220/325* (2020.02); *C08F 2438/03* (2013.01)

(56) References Cited

U.S. PATENT DOCUMENTS

| | | | | |
|---|---|---|---|---|
| 5,945,240 | A * | 8/1999 | Tashiro | G03G 5/0514 430/69 |
| 7,655,279 | B2 * | 2/2010 | Dietsche | C08L 33/14 427/388.1 |
| 8,853,101 | B1 | 10/2014 | Farrell et al. | |
| 9,458,353 | B1 * | 10/2016 | Cheng | C09D 125/18 |
| 11,857,997 | B2 * | 1/2024 | Afzali-Ardakani | B05D 3/005 |
| 2012/0273460 | A1 | 11/2012 | Kang et al. | |
| 2014/0335324 | A1 | 11/2014 | Kim et al. | |
| 2015/0093912 | A1 | 4/2015 | Wu et al. | |
| 2015/0197663 | A1 * | 7/2015 | Mizutani | C08L 53/00 428/156 |
| 2016/0280832 | A1 | 9/2016 | Kim et al. | |
| 2016/0280834 | A1 | 9/2016 | Kim et al. | |
| 2016/0304740 | A1 * | 10/2016 | Cheng | C08F 12/20 |
| 2017/0069486 | A1 | 3/2017 | Pathangi Sriraman | |

FOREIGN PATENT DOCUMENTS

| | | | | |
|---|---|---|---|---|
| EP | 3078689 | A1 | 10/2016 | |
| JP | 86392618 | A | 4/1988 | |
| JP | H06095441 | A | 4/1994 | |
| JP | 2009227836 | A | 10/2009 | |
| JP | 2012233287 | A | 11/2012 | |
| JP | 2016528713 | A | 9/2016 | |
| JP | 2017501262 | A | 1/2017 | |
| JP | 2017028239 | A * | 2/2017 | .......... H01G 9/0029 |
| JP | 2017530236 | A | 10/2017 | |
| KR | 20120122655 | A | 11/2012 | |
| KR | 20150067074 | A | 6/2015 | |
| KR | 20160061971 | A | 6/2016 | |
| KR | 20170029389 | A | 3/2017 | |
| WO | 2014184114 | A1 | 11/2014 | |

OTHER PUBLICATIONS

Extended European Search Report including Written Opinion for Application No. 18870910.9 dated Apr. 9, 2021, pp. 1-7.

* cited by examiner

[Figure 1]
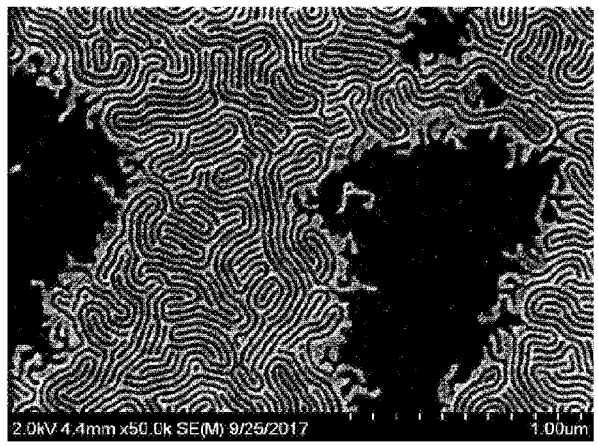
[Figure 2]
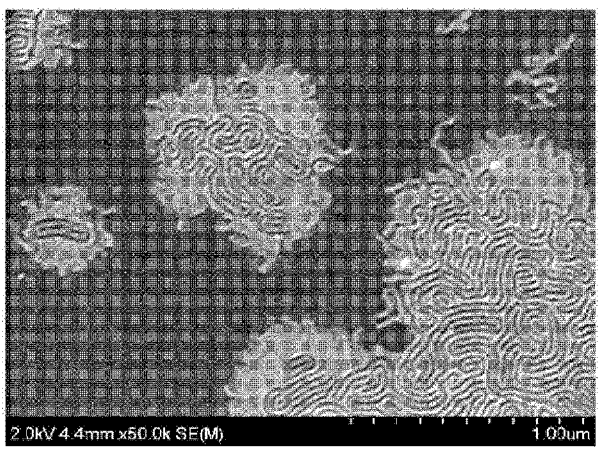
[Figure 3]
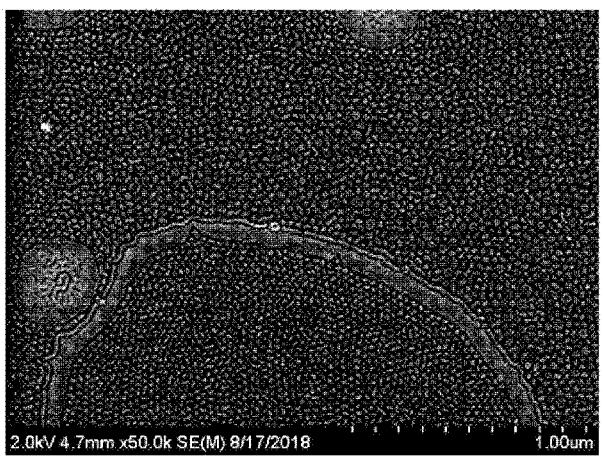

[Figure 4]
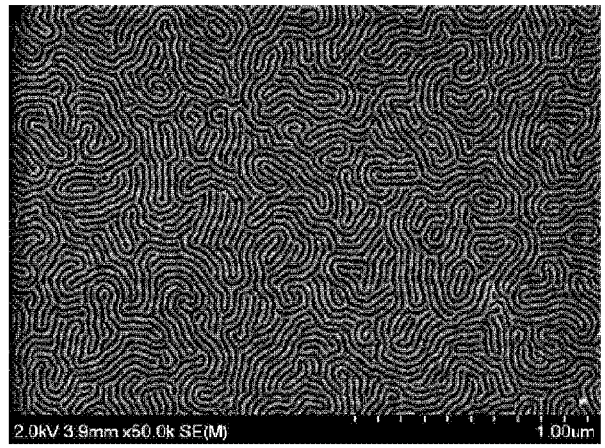
[Figure 5]
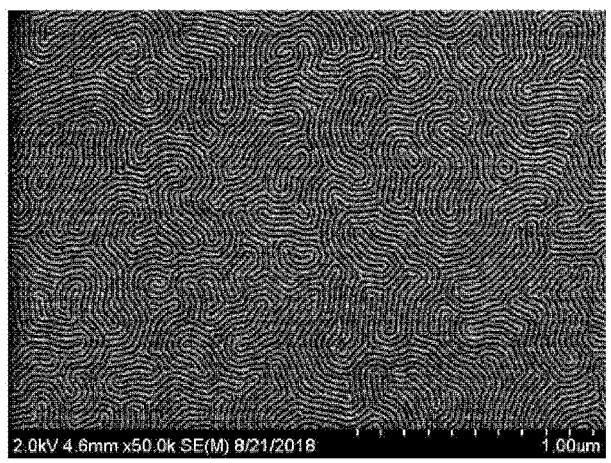
[Figure 6]
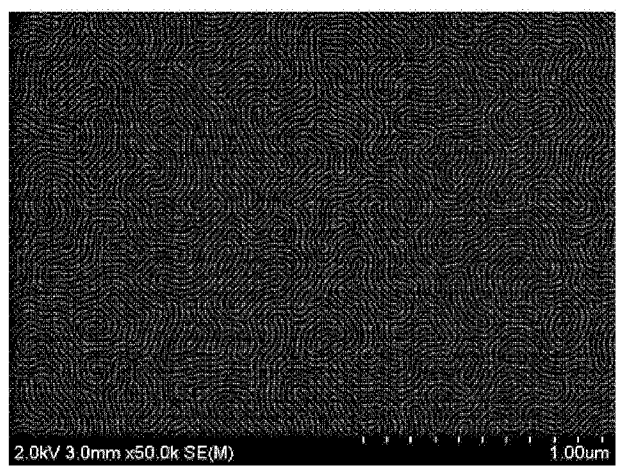

[Figure 7]
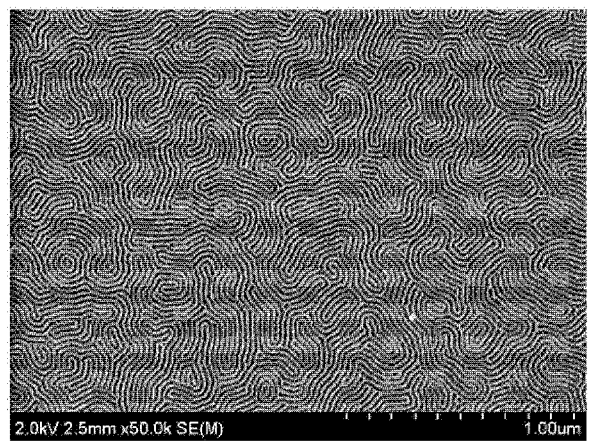
[Figure 8]
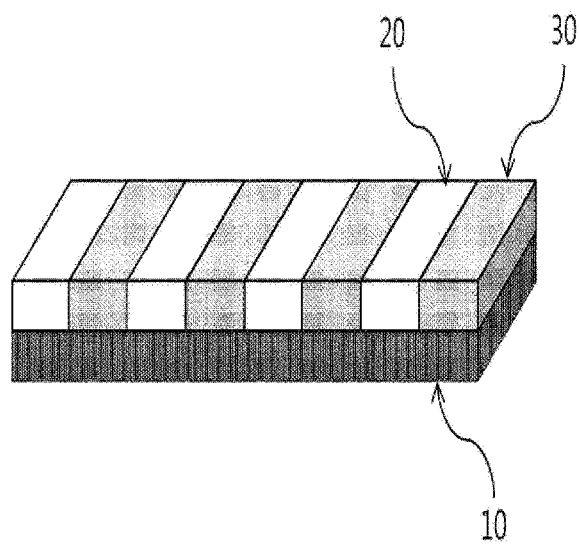

US 12,006,384 B2

RANDOM COPOLYMER AND PINNING COMPOSITION COMPRISING THE SAME

This application is a national phase entry under 35 U.S.C. § 371 of International Application No. PCT/KR2018/012891 filed Oct. 29, 2018, which claims priority from Korean Patent Application No. 10-2017-0141006 filed Oct. 27, 2017, all of which are incorporated herein by reference.

TECHNICAL FIELD

The present application relates to a random copolymer and a pinning composition comprising the same.

BACKGROUND ART

In a block copolymer, two or more chemically distinct polymer chains are linked by covalent bonds. The block copolymer can be separated into regular microphases due to the self-assembly characteristics. Such a microphase separation phenomenon of the block copolymer is generally explained by volume fractions, molecular weights or mutual attraction coefficients (Flory-Huggins interaction parameter) among the constituents. In addition, the block copolymer can form various nanostructures such as nanostructural spheres, cylinders, gyroids or lamellas.

Usually, orientation of nanostructures in a membrane formed by a block copolymer is determined depending on whether any of blocks constituting the block copolymer is exposed to a surface of a base layer or air. That is, the orientation of nanostructures can be determined by selective wetting of the blocks constituting the block copolymer. In general, a number of base layers have polarity and the air has non-polarity. Thus, a block having a larger polarity in a block copolymer is wetted to the base layer, and a block having a smaller polarity in the block copolymer is wetted to an interface with air, whereby the horizontal orientation is formed. In addition, when any one block and any other block of a block copolymer are both wetted on a base layer, the vertical orientation is formed. The vertical orientation may mean that an interface between any one block and any other block of a block copolymer is perpendicular to a substrate.

In applying such vertically or horizontally oriented self-assembly structures of the block copolymer to actual processes, directionality and location selection properties of the pattern formed by, particularly, the vertically oriented self-assembly structure, are very important. For this purpose, a method of imparting a pre-pattern on a substrate using a process such as grapho-epitaxy or chemo-epitaxy is used.

Here, the chemo-epitaxy process is a method of forming on a polar base layer a pattern having a different chemical composition, for example, a pinning layer to induce the orientation of the self-assembly structure of the block copolymer. However, a typical pinning layer reacts simultaneously not only with the base layer but also with a neutral layer during a process of forming the same. When the pinning layer and the neutral layer react, it is possible to cause defects in the vertical orientation of the block copolymer. Accordingly, in order to suppress the reaction with the neutral layer, a process of forming a pinning layer at a low temperature, for example, a temperature of less than 130° C. has been attempted. However, there is a problem that a typical pinning layer cannot sufficiently bond to a base layer at a low temperature, for example, at a temperature of less than 130° C.

DISCLOSURE

Technical Problem

It is one object of the present application to provide a random copolymer and a pinning composition comprising the same.

Technical Solution

In the present application, the term "monovalent or divalent hydrocarbon group" may mean a monovalent or divalent residue derived from a compound composed of carbon and hydrogen or a derivative thereof, unless otherwise specified. Here, the compound composed of carbon and hydrogen can be exemplified by alkane, alkene, alkyne, or aromatic hydrocarbon.

In the present application, the term "alkyl group" may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted by one or more substituents.

In the present application, the term "alkoxy group" may mean an alkoxy group having 1 to 20 carbon atoms, 1 to 16 carbon atoms, 1 to 12 carbon atoms, 1 to 8 carbon atoms, 1 to 4 carbon atoms or 1 to 2 carbon atoms, unless otherwise specified. The alkoxy group may be a linear, branched or cyclic alkoxy group, which may be optionally substituted by one or more substituents.

In the present application, the term "alkenyl group" or "alkynyl group" means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted by one or more substituents.

In the present application, the term "alkylene group" may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted by one or more substituents.

In the present application, the term "alkenylene group" or "alkynylene group" may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted by one or more substituents.

In the present application, the term "aryl group" or "arylene group" may mean, unless otherwise specified, a monovalent residue or divalent residue derived from a compound comprising one benzene structure, or a structure in which two or more benzene rings are linked while sharing one or two carbon atoms, or linked by any linker, or a derivative thereof.

The aryl group or arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present application, the term "aromatic structure" may mean the aryl group or arylene group.

In the present application, the term "alicyclic ring structure" means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term "single bond" may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, linear chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

In the present application, the fact that a certain polymer (a polymer such as a block copolymer or a random copolymer) contains a certain unit of a compound may mean that the compound undergoes a polymerization reaction to form a skeleton in the polymer.

The present application relates to a random copolymer. In the present application, the term "random copolymer" may mean a polymer in which one or more units constituting it are irregularly bonded. Specifically, the random copolymer may mean a copolymer having a probability of finding a certain monomer unit irrespective of the type of the adjacent unit.

The random copolymer of the present application may comprise at least a unit represented by Formula 1 below:

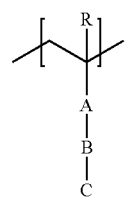

[Formula 1]

In Formula 1 above, R is hydrogen or an alkyl group, A is an oxygen atom, a sulfur atom, —S(=O)$_2$—, a carbonyl group, —C(=O)—X$_1$— or —X$_1$—C(=O)—, where X$_1$ is an oxygen atom or a sulfur atom, B is an alkylene group, an alkenylene group or an alkynylene group, and C is represented by Formula 2 below:

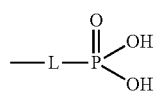

[Formula 2]

In Formula 2, L is a single bond or an oxygen atom. In Formula 2, L may be bonded to B in Formula 1. Also, when L in Formula 2 is a single bond, P in Formula 2 can be directly linked to B in Formula 1. In addition, in Formula 2, P means a phosphorus atom.

Thereafter, the random copolymer containing the unit represented by Formula 1 above can be included in a pinning layer, thereby allowing the pinning layer to sufficiently bond to a base layer in a substrate to be described below. Specifically, the random copolymer can comprise the unit to which the functional group represented by Formula 2 above is bonded, as shown in Formula 1, thereby allowing a pinning layer to be described below to sufficiently on a base layer.

The random copolymer containing the unit represented by Formula 1 may have high reactivity with the base layer. Thus, the pinning composition comprising the random copolymer can react with the base layer even at a low temperature, for example, a temperature of less than 130° C., 125° C. or lower, 120° C. or lower, 115° C. or lower, 110° C. or lower, 105° C. or lower, 100° C. or lower, 95° C. or lower, 90° C. or lower, 85° C. or lower, 80° C. or lower, 75° C. or lower, 70° C. or lower, 65° C. or lower, 60° C. or lower, 55° C. or lower, or less than 50° C. to form a pinning layer. The lower limit of the temperature is not particularly limited, but may be, for example, 20° C. or higher, 23° C. or higher, or 25° C. or higher.

Then, the pinning composition comprising the random copolymer may not react with a neutral layer to be described below. Accordingly, it can allow a block copolymer, which is described below, to form a vertical lamella structure having a high degree of alignment.

In one example, in Formula 1, R may be hydrogen or an alkyl group having 1 to 4 carbon atoms, and specifically may be an alkyl group having 1 to 4 carbon atoms. In another example, in Formula 1, B may be an alkylene group or alkenylene group having 1 to 4 carbon atoms, and specifically may be an alkylene group having 1 to 4 carbon atoms.

In one example, the random copolymer may further comprise a unit represented by Formula 3 or 4. That is, the random copolymer may also comprise a unit represented by Formula 1 and a unit represented by Formula 3, or may also comprise a unit represented by Formula 1 and a unit represented by Formula 4:

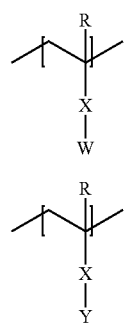

[Formula 3]

[Formula 4]

In Formula 3 or 4, R may be hydrogen or an alkyl group. In one example, R may be hydrogen or an alkyl group having 1 to 4 carbon atoms, and specifically may be an alkyl group having 1 to 4 carbon atoms.

In Formula 3 or 4, X may be a single bond, an oxygen atom, —S(=O)$_2$—, a carbonyl group, an alkylene group, an alkenylene group, an alkynylene group, —C(=O)—X$_1$—, or —X$_1$—C(=O)—, where X$_1$ may be an oxygen atom, a sulfur atom, an alkylene group, an alkenylene group or an alkynylene group. In one example, X may be a single bond, an oxygen atom, an alkylene group, an alkenylene group, an alkynylene group, —C(=O)—X₁—, or —X₁—C(=O)—, where $X_1$ may be a single bond, an oxygen atom, or an alkylene group.

In Formula 3, W may be an aryl group containing at least one halogen atom. In one example, W may be, for example, an aryl group having 6 to 12 carbon atoms substituted with 2 or more, 3 or more, 4 or more, or 5 or more halogen atoms. In one example, as the halogen atom, for example, a fluorine atom may be applied.

In one example, the unit of Formula 3 may also be represented by Formula 3-1:

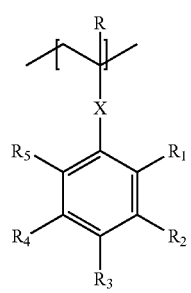

[Formula 3-1]

In Formula 3-1, R and X may be the same as R and X in Formula 3 above. In Formula 3-1, $R_1$ to $R_5$ are each independently hydrogen, an alkyl group, a haloalkyl group or a halogen atom, and the number of halogen atoms that $R_1$ to $R_5$ include is one or more. In Formula 3-1, $R_1$ to $R_5$ are each independently hydrogen, an alkyl group, a haloalkyl group or a halogen atom, but $R_1$ to $R_5$ may contain 1 or more, 2 or more, 3 or more, 4 or more, or 5 or more halogen atoms. In Formula 3-1, halogen atoms, for example, fluorine atoms, contained in each of $R_1$ to $R_5$ may be 10 or less, 9 or less, 8 or less, 7 or less, or 6 or less.

In Formula 4, Y may be a monovalent substituent including a ring structure in which a linear chain having eight or more chain-forming atoms is linked. In Formula 4, the monovalent substituent of Y may contain a chain structure formed by at least eight chain-forming atoms.

In the present application, the term "chain-forming atom" may mean an atom forming a linear chain structure of a predetermined chain. The chain may be linear or branched. However, the number of chain-forming atoms is calculated by only the number of atoms forming the longest linear chain. Other atoms bonded to the chain-forming atoms (for example, when the chain-forming atom is a carbon atom, a hydrogen atom bonding to the carbon atom, etc.) are not calculated as the number of chain-forming atoms. In addition, when the chain is branched, the number of chain-forming atoms may mean the number of atoms forming the longest chain. For example, when the chain is an n-pentyl group, all of the chain-forming atoms are carbon, the number is 5, and even if the chain is a 2-methylpentyl group, all of the chain-forming atoms are carbon, the number is 5.

As the chain-forming atom, carbon, oxygen, sulfur, nitrogen and the like can be exemplified. A suitable chain-forming atom may be carbon, oxygen or nitrogen, and specifically may be carbon or oxygen. The number of chain-forming atoms may be 8 or more, 9 or more, 10 or more, 11 or more, or 12 or more. The number of the chain-forming atoms may also be 30 or less, 25 or less, 20 or less, or 16 or less.

The chain may be a linear hydrocarbon chain such as a linear alkyl group. In this case, the alkyl group may be an alkyl group having 8 or more carbon atoms, 10 or more carbon atoms, or 12 or more carbon atoms. In addition, the alkyl group may be an alkyl group having 30 or less carbon atoms, 25 or less carbon atoms, 20 or less carbon atoms, or 16 or less carbon atoms. One or more carbon atoms of the alkyl group may optionally be substituted with oxygen atoms, and at least one hydrogen atom of the alkyl group may be optionally substituted by another substituent.

In Formula 4, Y may include a ring structure, and the chain may be connected to the ring structure. Such a ring structure can further improve self-assembly properties and the like of a block copolymer to be described below. Furthermore, the ring structure may be an aromatic ring structure or an alicyclic ring structure.

The chain may be directly connected to the ring structure or may be connected thereto via a linker. As the linker, an oxygen atom, a sulfur atom, —NR₁—, S(=O)₂—, a carbonyl group, an alkylene group, an alkenylene group, an alkynylene group, —C(=O)—X₁— or —X₁—C(=O)—, and the like may be exemplified. Here, $R_1$ may be hydrogen, an alkyl group, an alkenyl group, an alkynyl group, an alkoxy group or an aryl group. Here, $X_1$ may be a single bond, an oxygen atom, a sulfur atom, —NR₂—, an alkylene group, an alkenylene group or an alkynylene group. Here, $R_2$ may be hydrogen, an alkyl group, an alkenyl group, an alkynyl group, an alkoxy group or an aryl group.

As an appropriate linker, an oxygen atom or a nitrogen atom may be exemplified. The chain may be connected to the aromatic structure via, for example, an oxygen atom or a nitrogen atom. In this case, the linker may be an oxygen atom, or may be —NR₁— (wherein $R_1$ may be hydrogen, an alkyl group, an alkenyl group, an alkynyl group, an alkoxy group or an aryl group).

In one example, the unit of Formula 4 may also be represented by Formula 4-1 below:

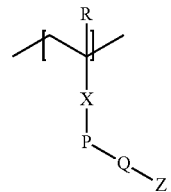

[Formula 4-1]

In Formula 4-1, R and X may be the same as R and X in Formula 4. Here, P is an arylene group, Q is a single bond, an oxygen atom or —NR₃—, where $R_3$ is hydrogen, an alkyl group, an alkenyl group, an alkynyl group, an alkoxy group or an aryl group, and Z is the chain having 8 or more chain-forming atoms.

In one example, in Formula 4-1, P may be an arylene group having 6 to 12 carbon atoms, for example, a phenylene group, but is not limited thereto. In another example, Q in Formula 4-1 may include an oxygen atom or —NR₁— (where $R_1$ is hydrogen, an alkyl group, an alkenyl group, an alkynyl group, an alkoxy group or an aryl group) and the like.

In one example, the unit of Formula 4-1 may include a unit wherein R is hydrogen or an alkyl group having 1 to 4 carbon atoms, X is —C(=O)—O—, P is an arylene group having 6 to 12 carbon atoms or phenylene, Q is an oxygen atom, and Z is a chain having 8 or more chain-forming atoms.

The random copolymer of the present application may comprise the unit of Formula 3 or 4 above in addition to the unit of Formula 1 above, thereby allowing the block copolymer having various structures to exhibit excellent self-assembly properties. In addition, accordingly, it is possible to impart appropriate directionality to the pattern formed by the self-assembly structure of the block copolymer.

In the random copolymer, the unit of Formula 3 or 4 may be contained in the random copolymer in an amount of 80 wt % to 99.9 wt %. This ratio is not particularly limited, but may also be adjusted, for example, depending on the kind of the block copolymer to which the pinning layer comprising the random copolymer of the present application is applied. In one example, the unit having the ring structure may be contained in the random copolymer in an amount of 81 wt % or more, 82 wt % or more, 83 wt % or more, 84 wt % or more, 85 wt % or more, 86 wt % or more, 87 wt % or more, 88 wt % or more, 89 wt % or more, 90 wt % or more, 91 wt % or more, 92 wt % or more, 93 wt % or more, 94 wt % or more, or 95 wt % or more, but is not limited thereto. In another example, the ratio may be 99.8 wt % or less, 99.7 wt % or less, 99.6 wt % or less, 99.5 wt % or less, 99.4 wt % or less, 99.3 wt % or less, 99.2 wt % or less, 99.1 wt % or less, or 99.0 wt % or less, but is not limited thereto.

In another example, the random copolymer may include 1 part by weight to 30 parts by weight of the unit represented by Formula 1 relative to 100 parts by weight of the unit represented by Formula 3 or 4 above. The ratio of the unit represented by Formula 1 is not particularly limited, but may also be adjusted depending on the type of the substrate to which the pinning layer comprising the random copolymer is applied. For example, the random copolymer may contain the unit represented by Formula 1 in an amount of 1.1 parts by weight or more, 1.2 parts by weight or more, 1.3 parts by weight or more, 1.4 parts by weight or more, 1.5 parts by weight or more, 1.6 parts by weight or more, 1.7 parts by weight or more, 1.8 parts by weight or more, 1.9 parts by weight or more, or 2.0 parts by weight or more, and may contain it in an amount of 26 parts by weight or less, 22 parts by weight or less, 18 parts by weight or less, 14 parts by weight or less, 12 parts by weight or less, 10 parts by weight or less, 9 parts by weight or less, 8 parts by weight or less, 7 parts by weight or less, or 6 parts by weight or less, relative to 100 parts by weight of the unit represented by Formula 3 or 4, but is not limited thereto.

Also, the random copolymer may further comprise an additional unit (third unit), if necessary, in addition to the unit of Formula 1 (first unit) and the unit represented by Formula 3 or 4 (second unit). This third unit may be exemplified by a polymerization unit derived from a (meth) acrylic acid ester compound such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-hexyl (meth)acrylate or octyl meth(acrylate), a polymerization unit derived from a vinylpyridine such as 2-vinylpyridine or 4-vinylpyridine, or a polymerization unit derived from a styrene-based monomer such as styrene, 4-trimethylsilylstyrene, 2,3,4,5,6-pentafluorostyrene, 3,4,5-trifluorostyrene, 2,4,6-trifluorostyrene or 4-fluorostyrene, but is not limited thereto.

When the third unit is included in the random copolymer, the content thereof is not particularly limited. The content of the third unit may be adjusted, for example, according to the kind of the block copolymer applied to the pinning layer containing the random copolymer. For example, in the random copolymer, the third unit may be included in an amount of about 5 mol % to about 95 mol % relative to the entire random copolymer, but is not limited thereto. In another example, the random copolymer may comprise the third unit in an amount of about 5 mol % or more, 6 mol % or more, 7 mol % or more, 8 mol % or more, 9 mol % or more, or 10 mol % or more, and also may comprise it in an amount of 95 mol % or less, 94 mol % or less, 93 mol % or less, 92 mol % or less, 91 mol % or less, or 90 mol % or less. In the present application, the mol % can be calculated using the mole number calculated from the molecular weight and weight of the block copolymer or random copolymer.

The method of preparing the random copolymer is not particularly limited. For example, the random copolymer may be prepared by applying a free radical polymerization method or an LRP (living radical polymerization) method and the like. An example of the LRP method may be exemplified by an anion polymerization, an atom transfer radical polymerization method, a polymerization method by reversible addition-fragmentation chain transfer or a method of using an organotellurium compound as an initiator, and the like.

The anion polymerization method may mean that the polymerization is performed in the presence of an inorganic acid salt, such as an alkali metal or alkaline earth metal salt, or an organoaluminum compound using an organic rare earth metal complex or an organic alkali metal compound, and the like as an initiator.

An example of the atom transfer radical polymerization method may include, for example, an atom transfer radical polymerization method (ATRP) using an atom transfer radical polymerization agent as a polymerization initiator, an ARGET (activators regenerated by electron transfer) atom transfer radical polymerization method (ATRP), which uses an atom transfer radical polymerization agent as a polymerization initiator, but performs polymerization under an organic or inorganic reducing agent that generates electrons, an ICAR (initiator for continuous activator regeneration) atom transfer radical polymerization method, and the like.

As the method for polymerizing the random copolymer of the present application, a suitable method among the above-described methods may be adopted.

The kind of the radical initiator that can be used in the polymerization process is not particularly limited. As the radical initiator, for example, an azo-based initiator such as AIBN (azobisisobutyronitrile), ABCN (1,1'-azobis(cyclohexanecarbonitrile)) or 2,2'-azobis-(2,4-dimethylvaleronitrile) or a peroxide initiator such as BPO (benzoyl peroxide) or DTBP (di-tert-butyl peroxide), and the like can be applied.

Furthermore, depending on the type of the monomer contained in the random copolymer, as a method for polymerizing the same, for example, a polymerization method without using any initiator, such as a method using thermal self-initiation of a styrenic monomer, can also be applied.

The polymerization process can be performed, for example, in the presence of a suitable solvent. In this case, the applicable solvent can be exemplified by a solvent such as methylene chloride, 1,2-dichloroethane, chlorobenzene, dichlorobenzene, benzene, toluene, anisole, acetone, chloroform, tetrahydrofuran, dioxane, monoglyme, diglyme, dimethyl formamide, dimethylsulfoxide or dimethylacetamide, but is not limited thereto. After the polymerization reaction, a non-solvent is used, whereby the random copolymer can be obtained by precipitation, where the usable non-solvent can be exemplified by an alcohol such as methanol, ethanol, n-propanol or isopropanol, a glycol such as ethylene glycol, an alkane such as n-hexane, cyclohexane or n-heptane, an ether such as petroleum ether, and the like, but is not limited thereto.

In the polymer synthesis field, a method of producing a polymer according to the type of a monomer forming the polymer is known, and any of the known methods may be applied upon producing the random copolymer of the present application.

The present application also relates to a pinning composition. In the present application, the term "pinning composition" may mean a composition used to form a pinning layer. In addition, the term "pinning layer" may mean all kinds of layers which have high chemical affinity with any one of blocks constituting a block copolymer, so that directionality and location selection properties of the pattern formed of the block copolymer can be imparted. Furthermore, the pattern of the block copolymer may mean a shape in which one or more blocks constituting the block copolymer are repeated regularly or irregularly and formed.

The pinning composition of the present application may comprise only the random copolymer. In addition, the pinning composition of the present application may further comprise, if necessary, other components in addition to the above random copolymer. As other components that may be included together with the random copolymer, for example, a suitable thermal initiator or photoinitiator and the like may also be exemplified, and a solvent or a non-solvent and the like may also be exemplified, depending on the components included in the random copolymer.

The pinning composition may also comprise the random copolymer in an amount of 0.1 wt % to 20 wt % relative to the total composition. The ratio is not particularly limited, but may be, for example, about 0.2 wt % or more, about 0.3 wt % or more, about 0.4 wt % or more, about 0.5 wt % or more, about 0.6 wt % or more, about 0.7 wt % or more, about 0.8 wt % or more, about 0.9 wt % or more, or 1.0 wt % or more, and may be about 19 wt % or less, about 17 wt % or less, about 15 wt % or less, about 13 wt % or less, about 11 wt % or less, about 9 wt % or less, about 8 wt % or less, about 7 wt % or less, about 6 wt % or less, about 5 wt % or less, about 4 wt % or less, about 3 wt % or less, or about 2 wt % or less.

The present application also relates to a substrate. The substrate of the present application may comprise a pinning layer formed on a surface of a base layer. Specifically, the substrate of the present application may comprise: a base layer; and a pinning layer present on the surface of the base layer. The pinning layer can be formed by the above-described pinning composition. In addition, the details of the term pinning and pinning layer are the same as those described above, and therefore will be omitted.

The pinning layer may comprise the above-mentioned random copolymer. That is, the pinning layer may be the same as the random copolymer contained in the above-described pinning composition. Specifically, the pinning layer may comprise a random copolymer including the unit of Formula 1 and the unit represented by Formula 3 or 4 as described above. Since the random copolymer is the same as the random copolymer contained in the pinning composition, the description thereof will be omitted.

Also, the pinning layer may be formed on a suitable base layer. The base layer on which the pinning layer is formed may be exemplified by a silicon wafer, a silicon oxide substrate, a silicon nitride substrate or a crosslinked PET (poly(ethylene terephthalate)) film and the like, but is not limited thereto.

The pinning layer may comprise the random copolymer at least as a main component. Here, the fact that the pinning layer comprises the random copolymer as a main component may mean that the relevant pinning layer comprises only the random copolymer or comprises it in an amount of about 50 wt % or more, 55 wt % or more, 60 wt % or more, 65 wt % or more, 70 wt % or more, 75 wt % or more, 80 wt % or more, 85 wt % or more, or 90 wt % or more on the basis of the solid content. In another example, the ratio may also be about 100 wt % or less, or about 99 wt % or less or so.

In one example, the pinning layer may have a thickness of, for example, about 1 nm to 100 nm, and in another example, it may have a thickness of about 2 nm to 50 nm. Within the thickness range, surface uniformity of the pinning layer can be maintained. Furthermore, within the thickness range, the directionality of the vertically oriented structure in the block copolymer can be appropriately derived, and thereafter, etching selectivity can be advantageously not impaired in an etching process.

In the present application, the term "vertical orientation" indicates the orientation property of the block copolymer, which may mean a case where the orientation direction of the self-assembly structure formed by the block copolymer is perpendicular to the substrate direction. For example, the vertical orientation may mean the case where each block domain of the self-assembled block copolymer lies side by side on the substrate surface and the interface region of the block domain is formed substantially perpendicular to the substrate surface. In another example, the vertical orientation may also mean a state where all the block domains of the self-assembled block copolymer are wetted to the substrate surface.

In the present application, the term "vertical" is an expression that takes into account an error, which may have, for example, a meaning including an error within ±10 degrees, within ±8 degrees, within ±6 degrees, within ±4 degrees, or within ±2 degrees.

The pinning layer of the present application may form a pattern on the surface of the base layer. The pattern may be, for example, a stripe pattern. The stripe pattern means a form in which two or more stripe-shaped pinning layers are formed on a surface of a substrate to form a pattern. The pattern formed by the self-assembly structure of the block copolymer to be described below may exhibit the directionality by the pattern formed by the pinning layer. In addition, the self-assembly structure of the block copolymer to be described below may also be formed on the base layer or may also be formed on the pinning layer.

The method for forming the pinning layer is not particularly limited, and for example, the pinning layer may be formed by coating the pinning composition on the base layer and annealing it, as described below.

In one example, the substrate may further comprise a neutral layer present on the surface of the base layer. A block copolymer having a vertically oriented self-assembly structure can be formed more efficiently by inducing the self-assembly of the block copolymer, which is described below, on the base layer on which the pinning layer and the neutral layer are formed together. In the present application, the term "neutral layer" may mean all kinds of layers capable of inducing the vertical orientation of the block copolymer.

The neutral layer and the pinning layer may form alternately repeated stripe patterns on the base layer. In addition, the repeating pattern of the neutral layer and the pinning layer may be regular or irregular. Here, the stripe pattern may mean a form in which two or more of the pinning layer (20) and the neutral layer (30) are alternately formed on the surface of the base layer (10), for example, as schematically shown in FIG. 8. The method for forming the stripe patterns in which the pinning layer (20) and the neutral layer (30) are alternately repeated is not particularly limited. For example, as the method, a method of (1) coating a composition for forming a neutral layer on a base layer on which a pinning layer is formed, and then annealing the composition; or (2) coating a pinning layer composition on a base layer on which a neutral layer is formed, and then annealing the composition can be applied, but is not limited thereto.

The neutral layer may comprise a random copolymer. The random copolymer contained in the neutral layer may also be different from the random copolymer contained in the pinning layer. The random copolymer contained in the neutral layer may also comprise the same units as the units contained in the random copolymer of the pinning layer. In one example, the random copolymer contained in the neutral layer may comprise the unit represented by Formula 3 and the unit represented by Formula 4 as described above.

In one example, in the random copolymer contained in the neutral layer, the ratio (B/A) of the mole number (B) of the unit represented by Formula 3 above to the mole number (A) of the unit represented by Formula 4 above may be in a range of 2 to 10. The ratio (B/A) of the mole number may be, for example, 2.00 or more, 2.04 or more, 2.08 or more, 2.12 or more, 2.16 or more, 2.20 or more, 2.24 or more, 2.28 or more, or 2.32 or more, but is not limited thereto. In another example, the ratio (B/A) may also be 10 or less, 9.8 or less, 9.6 or less, 9.4 or less, 9.2 or less, or 9.0 or less, but is not limited thereto.

In the random copolymer contained in the neutral layer, the unit of Formula 4 above may be included in the random copolymer in a ratio in a range of 9 mol % to 32 mol % of the total mole number of the random copolymer in the neutral layer. In another example, the ratio may be 10 mol % or more, 11 mol % or more, 12 mol % or more, 13 mol % or more, 14 mol % or more or 15 mol % or more, and may be 31 mol % or less, 30 mol % or less, 29 mol % or less, 28 mol % or less, 27 mol % or less, 26 mol % or less, 25 mol % or less, 24 mol % or less, 23 mol % or less, 22 mol % or less, 21 mol % or less, 20 mol % or less, 19 mol % or less, 18 mol % or less, 17 mol % or less, 16 mol % or less, or 15 mol % or less.

The random copolymer contained in the neutral layer may further comprise other functional monomer units and the like in order to improve the reactivity with the base layer. An example of the functional monomer may be exemplified by glycidyl (meth)acrylate, 4-vinylbenzocyclobutene, 2-isocyanatoethyl acrylate, 2-isocyanatoethyl (meth)acrylate, 4-isocyanatobutyl acrylate, 4-isocyanatobutyl (meth)acrylate, hydroxymethyl acrylate, hydroxymethyl (meth)acrylate, 2-hydroxyethyl acrylate, 2-hydroxyethyl (meth)acrylate, 2-hydroxypropyl acrylate, 2-hydroxypropyl (meth)acrylate, 3-hydroxypropyl acrylate, 3-hydroxypropyl (meth)acrylate, 2-hydroxybutyl acrylate, 2-hydroxybutyl (meth)acrylate, 4-hydroxybutyl acrylate, 4-hydroxybutyl (meth)acrylate, 6-hydroxyhexyl acrylate, 6-hydroxyhexyl (meth)acrylate, maleic anhydride, gamma-butyrolactone (meth)acrylate, N-vinylpyrrolidone, N-vinylphthalimide, N-succinimidyl acrylate, norbornenelactone (meth)acrylate, (meth)acrylic acid, acrylamide, N-methylol acrylamide or N-phenylacrylamide, and the like, but is not limited thereto. When the unit of the functional monomer is included in the random copolymer of the neutral layer, the unit of the functional monomer may be contained in an amount of 40 mol % or less based on the total random copolymer, and the lower limit is not particularly limited, but may be contained in a content of more than 0 mol %. In another example, the ratio (C/A) of the mole number (C) of the functional monomer unit to the mole number (A) of the unit of Formula 4 may be in a range of 0.1 to 2.0. In another example, the ratio (C/A) may be 0.2 or more, 0.3 or more, 0.4 or more, 0.5 or more, 0.6 or more, 0.7 or more, 0.8 or more, or 0.9 or more, and may be 1.9 or less, 1.8 or less, 1.7 or less, 1.6 or less, 1.5 or less, 1.4 or less, 1.3 or less, 1.2 or less, or 1.1 or less, but is not limited thereto.

The number average molecular weight (Mn) of the random copolymer in the neutral layer may be in a range of, for example, 3,000 to 300,000. In another example, the molecular weight (Mn) may be, for example, 3000 or more, 5000 or more, 7000 or more, 9000 or more, 10,000 or more, or 11000 or more. In another example, the molecular weight (Mn) may be 250,000 or less, 200,000 or less, 180,000 or less, 160,000 or less, 140,000 or less, 120000 or less, 100,000 or less, 90000 or less, 80000 or less, 70000 or less, 60000 or less, or 50000 or less or so. The unit of the number average molecular weight may be g/mol.

The random copolymer of the neutral layer may have polydispersity (Mw/Mn) in a range of 1.01 to 2.60. In another example, the polydispersity may be about 1.05 or more, or about 1.1 or more. In another example, the polydispersity may be about 2.6 or less, about 2.4 or less, about 2.2 or less, or about 2.0 or less. The neutral layer formed by such a random copolymer is advantageous for forming a highly aligned block copolymer membrane.

In the present application, the number average molecular weight and the polydispersity of a certain polymer may be values converted to standard polystyrene as measured through GPC (gel permeation chromatography).

The substrate of the present application may further comprise a polymer membrane. In addition, the polymer membrane may comprise a block copolymer including a first block and a second block different from the first block. The first block may have a chemically different structure from the second block. The substrate can be applied to various applications. The substrate may be applied to various electronic or electronic elements, a process of forming the pattern, a recording medium such as a magnetic storage medium or a flash memory, or a biosensor, and the like, or a process of manufacturing a separation membrane and the like.

In one example, the polymer membrane may be formed on the pinning layer, or may also be formed directly on the base layer. Specifically, the polymer membrane may also be formed directly on the stripe pattern of the pinning layer, or may also be formed directly on the base layer on which the stripe pattern of the pinning layer is not formed. In another example, the polymer membrane may also be present on the pinning layer and the neutral layer.

The block copolymer may implement a periodic structure such as spheres, cylinders, gyroids or lamellas through self-assembly. Specifically, when the block copolymer implements the sphere or lamella structure, the block copolymer may exist in a vertically oriented state.

The kind of the block copolymer that can be included in the polymer membrane is not particularly limited, but for example, the block copolymer can be applied thereto, which comprises the same unit as the unit having the ring structure included in the random copolymer of the pinning layer as a first block or a second block.

The first block or the second block of the block copolymer may comprise the unit of Formula 3 or the unit of Formula 4. For example, the block copolymer may comprise the unit of Formula 3 as the first block, and may comprise the unit of Formula 4 as the second block. Accordingly, the polymer membrane comprising the block copolymer may exhibit excellent phase separation characteristics on the neutral layer, and may also be vertically oriented while forming a regular structure such as a lamella shape or a cylinder shape.

The block copolymer of the present application may be a diblock copolymer including the first block and the second block as described above. Also, the block copolymer may be a multi-block copolymer of tri-blocks or more containing two or more of at least one of the first block and the second block as described above, or containing another kind of a third block.

The number average molecular weight (Mn) of the block copolymer may be in a range of, for example, 2,000 to 500,000. In another example, the number average molecular weight of the block copolymer may be 3000 or more, 4000 or more, 5000 or more, 6000 or more, 7000 or more, 8000 or more, 9000 or more, 10000 or more, 15000 or more, 20000 or more, 25000 or more, 30000 or more, 35000 or more, or 40000 or more, and may be 400000 or less, 300000 or less, 200000 or less, 100000 or less, 95000 or less, 90000 or less, 85000 or less, 80000 or less, 75000 or less, 70000 or less, 65000 or less, 60000 or less, 55000 or less, or 50000 or less, but is not limited thereto. The unit of the number average molecular weight of the block copolymer may be g/mol.

The block copolymer may have polydispersity (Mw/Mn) in a range of 1.01 to 1.50. In another example, the ratio may be 1.02 or more, 1.05 or more, 1.08 or more, 1.11 or more, 1.14 or more, or 1.17 or more, and may be 1.45 or less, 1.40 or less, 1.35 or less, 1.30 or less, 1.25 or less, or 1.20 or less, but is not limited thereto.

In this range, the block copolymer can exhibit proper self-assembly properties. The number average molecular weight of the block copolymer and the like can be adjusted in consideration of the desired self-assembly structure and the like.

When the block copolymer comprises at least the first block and the second block, the volume fraction of the first block, specifically, the block including the unit of Formula 3 as described above in the block copolymer may be in a range of 0.3 to 0.7. In another example, the ratio may be 0.4 or more, 0.5 or more, or 0.55 or more, and may be 0.65 or less, 0.63 or less, or 0.61 or less. Also, the sum of the volume fraction of the first block and the volume fraction of the second block (for example, the block including the unit of Formula 4 as described above) may be 1.

In the present application, the volume fraction of each block constituting the block copolymer can be obtained based on the density of each block and the molecular weight measured by GPC (gel permeation chromatography).

In the present application, a specific method for preparing the block copolymer is not particularly limited as long as it comprises the step of forming at least one block of the block copolymer by using the monomer having the structure as described above.

For example, as the method for preparing the block copolymer, the same method as the method for polymerizing the random copolymer can be applied. For example, the block copolymer can be prepared by a method which comprises polymerizing a reactant comprising monomers capable of forming the blocks in the presence of a radical initiator and a living radical polymerization reagent by a living radical polymerization method.

The method of forming the other block included in the copolymer together with a certain block upon the production of the block copolymer is not particularly limited. The process of preparing the block copolymer may further comprise, for example, a process of precipitating the polymerization product produced through the above process in a non-solvent.

The kind of the radical initiator is not particularly limited, which can be appropriately selected in consideration of the polymerization efficiency. As the radical initiator, for example, an azo compound such as AIBN (azobisisobutyronitrile), ABCN (1,1'-azobis(cyclohexanecarbonitrile)) or 2,2'-azobis-2,4-dimethylvaleronitrile, or peroxide series such as BPO (benzoyl peroxide) or DTBP (di-t-butyl peroxide) can be used.

The living radical polymerization process can be performed in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, for example, alcohols such as methanol, ethanol, normal propanol or isopropanol, glycols such as ethylene glycol, n-hexane, cyclohexane, n-heptane or ether series such as petroleum ether, can be used, without being limited thereto.

The present application also relates to a method for producing a patterned substrate. The production method of the present application may comprise a step of coating the above-described pinning composition on a base layer and annealing the base layer coated with the pinning composition. Here, the annealing may be thermal annealing or solvent annealing. Specifically, the annealing may be thermal annealing. In addition, the base layer may be the same as the base layer applied in the above-described substrate, and a description thereof will be omitted.

The thermal annealing can be performed based on, for example, the phase transition temperature or the glass transition temperature of the random copolymer contained in the pinning composition. Specifically, the thermal annealing can be performed at a temperature above the glass transition temperature or the phase transition temperature.

The random copolymer contained in the pinning composition may have a glass transition temperature or a phase transition temperature lower than that of a polymer contained in a typical pinning composition. Thus, the annealing of the present application can be performed at a temperature lower than the temperature in the annealing for forming a typical pinning layer.

For example, the production method of the present application can perform the thermal annealing at a temperature of less than about 130° C. The temperature may be 125° C. or lower, 120° C. or lower, 115° C. or lower, 110° C. or lower, 105° C. or lower, 100° C. or lower, 95° C. or lower, 90° C. or lower, 85° C. or lower, 80° C. or lower, 75° C. or lower, 70° C. or lower, 65° C. or lower, 60° C. or lower, 55° C. or lower, or less than 50° C. The lower limit of the temperature is not particularly limited, but may be, for example, 10° C. or higher, 15° C. or higher, or 20° C. or higher. When the pinning composition is thermally annealed at a temperature in the above range, the above-described pinning composition can sufficiently react with the base layer to form a pinning layer.

The temperature and time in the thermal annealing can be adjusted to an appropriate level in consideration of the composition of the random copolymer in the pinning layer composition. The time required for the thermal annealing can be changed as needed. For example, in the production method of the present application, the thermal annealing can be performed for a time in the range of about 1 minute to 72 hours or about 1 minute to 24 hours.

In the production method of the present application, a neutral layer may be formed on the base layer that the annealing is performed. Furthermore, after the annealing, the pinning layer and the neutral layer may form a stripe pattern. Specifically, a pattern of the neutral layer may be present on the base layer that the annealing of the pinning composition is performed, and after the coating and annealing of the pinning composition, the pinning layer and the neutral layer may also be alternately present.

In another example, when the pinning composition is thermally annealed on the base layer on which the neutral layer is formed and at a temperature in the aforementioned range, the pinning layer can form the stripe pattern with the neutral layer without reaction with the neutral layer. Accordingly, defects that may occur when the self-assembly structure of the block copolymer is formed may be minimized. The random copolymer contained in the neutral layer is the same as described above. Therefore, a detailed description thereof will be omitted.

As the method of forming a layer of a pinning composition on the base layer, on which the neutral layer is formed, and thermally annealing it, a method of forming the neutral layer in a patterned form on the base layer, followed by coating the pinning composition, and then annealing it may also be applied. In this way, for example, a pinning layer having a nano-sized fine pattern can be formed.

In the method, the method of forming the neutral layer in the patterned form is not particularly limited. For example, only a part of the neutral layer formed on the substrate may also be removed by partially irradiating the polymer membrane with appropriate electromagnetic waves, for example, ultraviolet rays or the like, or by covering the neutral layer with a mask and then irradiating it with ultraviolet rays or the like. In this case, the ultraviolet irradiation condition may be determined depending on the type of the neutral layer. For example, ultraviolet rays having a wavelength of about 254 nm can be irradiated for 1 minute to 60 minutes to remove a part of the neutral layer. In addition, the neutral layer decomposed by ultraviolet rays may also be further removed by treatment with an acid solution or the like following ultraviolet irradiation.

The method for producing a patterned substrate of the present application may further comprise, after the annealing, a step of forming a polymer membrane comprising a first block and a second block different from the first block in a self-assembled state on a base layer on which a pinning layer is formed or a base layer on which a neutral layer and a pinning layer are formed.

When the self-assembly of the block copolymer in the polymer membrane formed on the base layer on which the pinning layer is formed or the base layer on which the neutral layer and the pinning layer are formed is induced, the block having the surface energy similar to that of the pinning layer may be located on the pinning layer. Accordingly, the patterns formed by the self-assembly structure of the block copolymer can be vertically oriented on the substrate.

The method of forming such a polymer membrane using a block copolymer is not particularly limited. For example, the method can induce the self-assembly of the block copolymer in the polymer membrane by coating the polymer composition comprising the block copolymer on the neutral layer and/or the pinning layer, and annealing it. For example, the method can form the polymer membrane, on which the self-assembly structure of the block copolymer is formed, by coating the polymer composition on the neutral layer and/or the pinning layer by a method such as coating, and annealing it. Here, the annealing may be thermal annealing or solvent annealing. Specifically, the annealing may be thermal annealing. The method may further comprise a process of coating the polymer composition and then aging it, if necessary.

The thermal annealing may be performed based on, for example, the phase transition temperature or the glass transition temperature of the block copolymer. For example, the thermal annealing may be performed at a temperature above the glass transition temperature or the phase transition temperature. The time for which this heat treatment is performed is not particularly limited, and it can be performed for a time in a range of, for example, about 1 minute to 72 hours, but the time can be changed as needed. Furthermore, the temperature in the thermal annealing may be, for example, about 100° C. to 250° C. or so, but this can be adjusted in consideration of the block copolymer to be used.

In addition, the aging may also be performed in a non-polar solvent and/or a polar solvent at room temperature for about 1 minute to 72 hours.

Also, the method for producing a patterned substrate of the present application may further comprise a step of selectively removing the first or second block of the block copolymer in the polymer membrane. By selectively removing the first or second block of the block copolymer, the pattern of the block copolymer can be formed on the above-described substrate. For example, in addition, the method may further comprise, after forming a polymer membrane comprising the block copolymer on a substrate and selectively removing one or more blocks of the block copolymer existing in the membrane, a step of etching the substrate. That is, the substrate can be etched using the polymer membrane, from which one or more blocks of the block copolymer have been removed, as a mask. In this way, it is possible to form, for example, a nano-sized fine pattern. Furthermore, the pattern of the substrate can be changed according to the shape of the block copolymer in the polymer membrane, where an example thereof may include nano-rods or nano-holes, and the like. If necessary, for pattern formation, other copolymers different from the block copolymer or homopolymers, and the like may be mixed into the polymer composition.

The type of the substrate to be applied to this method is not particularly limited, which can be selected as required. As the substrate, for example, silicon oxide or the like can be applied.

The method can form a pattern having a size of nano-unit in silicon oxide showing a high aspect ratio. Specifically, the method may comprise forming a polymer membrane that a block copolymer forms a predetermined structure on a substrate of silicon oxide, and then selectively removing any one block of the block copolymer, followed by etching the substrate of silicon oxide. As the etching, for example, a reactive ion etching method may be applied, whereby the substrate of silicon oxide may have various forms such as a pattern of nano-rods or nano holes. Through this method, a nanopattern having a large aspect ratio can also be formed.

For example, the pattern can be implemented in a size of several tens of nanometers, and the substrate having such a pattern can be applied to various applications including, for example, a next generation magnetic recording medium for information electronics and the like.

In the above method, a method of selectively removing any one block of the block copolymer is not particularly limited. The removal method may be, for example, a method of irradiating the polymer membrane with appropriate electromagnetic waves, ultraviolet rays or the like to remove a relatively soft block. In this case, the ultraviolet irradiation condition can be determined according to the composition of the blocks constituting the block copolymer. In addition, the ultraviolet irradiation may be, for example, irradiation of ultraviolet rays having a wavelength of about 254 nm for 1 minute to 60 minutes.

Furthermore, in the above method, the polymer membrane may also be treated with an acid or the like, following the ultraviolet irradiation, to further remove any one block of the block copolymer decomposed by the ultraviolet rays.

In addition, when the substrate is etched using the polymer membrane including the block copolymer, from which the block has been selectively removed, as a mask, the etching method is not particularly limited. The etching may be, for example, the reactive ion etching using, for example, a reactive gas such as $CF_4$/Ar. Furthermore, following the reactive ion etching, the polymer membrane may also be removed from the substrate by oxygen plasma treatment or the like.

Advantageous Effects

The pinning composition of the present application can bond with a base layer even at a low temperature to form a pinning layer.

The pinning composition of the present application can impart orientation and positional selectivity of the self-assembly structure of the block copolymer formed on the substrate.

The pinning composition of the present application can allow for the block copolymer formed on the substrate to exhibit excellent reaction selectivity.

The pinning composition of the present application can make the block copolymer formed on the substrate have no defects and have a vertical lamella structure with high degree of alignment.

BRIEF DESCRIPTION OF DRAWINGS

FIGS. 1 to 3 are SEM images for Examples 1 to 3, respectively.
FIG. 4 is an SEM image for Comparative Example 1.
FIGS. 5 to 7 are SEM images for Examples 4 to 6, respectively.
FIG. 8 is a schematic diagram of a stripe pattern in which a pinning layer and a neutral layer are formed on a substrate.

MODE FOR INVENTION

Hereinafter, the present application will be described in detail by way of examples according to the present application and comparative examples, but the scope of the present application is not limited by the following examples.
1. NMR Measurement
NMR analyses were performed at room temperature using an NMR spectrometer including a Varian Unity Inova (500 MHz) spectrometer with a triple resonance 5 mm probe. An analyte was diluted in a solvent for NMR measurement ($CDCl_3$) to a concentration of about 10 mg/ml, and chemical shifts were expressed in ppm.
<Application Abbreviation>
br=broad signal, s=singlet, d=doublet, dd=double doublet, t=triplet, dt=double triplet, q=quartet, p=quintet, m=multiplet.

2. GPC (Gel Permeation Chromatography)
The number average molecular weight (Mn) and the molecular weight distribution were measured using GPC (gel permeation chromatography). Into a 5 mL vial, an analyte such as block copolymers of Examples or Comparative Examples or a macro initiator is put and diluted in THF (tetrahydrofuran) to be a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.
<GPC Measurement Conditions>
Instrument: 1200 series from Agilent Technologies
Column: using two PLgel mixed B from Polymer laboratories
Solvent: THF
Column temperature: 35° C.
Sample concentration: 1 mg/mL, 200 μL injection
Standard samples: Polystyrene (Mp: 3900000, 723000, 316500, 52200, 31400, 7200, 3940, 485)
3. Measurement of Volume Fraction
The volume fraction of each block of the block copolymer was calculated based on the density at room temperature of each block and the molecular weight measured by GPC. Here, the density was measured using a buoyancy method. Specifically, a sample to be analyzed was placed in a solvent (ethanol) in which the mass and density in air were known, and the density was calculated through its mass.

Preparation Example 1. Synthesis of Monomer (A)

A compound (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen condition. After the reaction, the remaining potassium carbonate was filtered off and the acetonitrile used in the reaction was also removed. A mixed solvent of DCM (dichloromethane) and water was added thereto to work up the mixture, and the separated organic layers were collected and passed through $MgSO_4$ to be dehydrated. Subsequently, the target product (4-dodecyloxyphenol) (9.8 g, 35.2 mmol) in a white solid phase was obtained in a yield of about 37% using DCM (dichloromethane) in column chromatography.
<NMR Analysis Results>
$^1$H-NMR ($CDCl_3$): δ6.77 (dd, 4H); δ4.45 (s, 1H); δ3.89 (t, 2H); δ1.75 (p, 2H); δ1.43 (p, 2H); δ1.33-1.26 (m, 16H); δ0.88 (t, 3H).

The synthesized 4-docecyloxyphenol (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours under nitrogen. After completion of the reaction, the salt (urea salt) formed during the reaction was filtered off and the remaining methylene chloride was also removed. Impurities were removed using hexane and DCM (dichloromethane) as the mobile phase in column chromatography and the product obtained again was recrystallized in a mixed solvent of methanol and water (1:1 mix) to obtain the white solid phase target product (7.7 g, 22.2 mmol) in a yield of 63%.

<NMR Analysis Results>

$^1$H-NMR (CDCl$_3$): δ7.02 (dd, 2H); δ6.89 (dd, 2H); δ6.32 (dt, 1H); δ5.73 (dt, 1H); δ3.94 (t, 2H); δ2.05 (dd, 3H); δ1.76 (p, 2H); δ1.43 (p, 2H); 1.34-1.27 (m, 16H); δ0.88 (t, 3H).

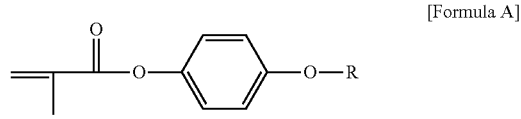

[Formula A]

In Formula A, R is a linear alkyl group having 12 carbon atoms.

Preparation Example 2. Synthesis of Random Copolymer (B)

1.677 g of pentafluorostyrene, 0.084 g of (methacryloyloxy)methyl phosphonic acid (hMAPC1), 10 mg of an RAFT (reversible addition-fragmentation chain transfer) reagent (2-cyano-2-propyl benzodithioate), 6 mg of V-40 (1,1'-azobis(cyclohexanecarbonitrile)) and 1.777 g of trifluorotoluene were placed in a 10 mL flask (Schlenk flask), and stirred at room temperature for 30 minutes under a nitrogen atmosphere, and then an RAFT (reversible addition-fragmentation chain transfer) polymerization reaction was performed at 95° C. for 3 hours. After the polymerization, the reaction solution was precipitated in 200 mL of methanol as an extraction solvent, filtered under reduced pressure and then dried to prepare a random copolymer (B). In the random copolymer (B), the content of pentafluorostyrene-derived units was about 94.3 wt %.

Preparation Example 3. Synthesis of Random Copolymer (C)

2.974 g of the monomer (A) of Preparation Example 1, 0.081 g of (methacryloyloxy)methyl phosphonic acid (hMAPC1), 10 mg of an RAFT (reversible addition-fragmentation chain transfer) reagent (2-cyano-2-propyl benzodithioate), 6 mg of V-40 (1,1'-azobis(cyclohexanecarbonitrile)) and 1.777 g of trifluorotoluene were placed in a 10 mL flask (Schlenk flask), and stirred at room temperature for 30 minutes under a nitrogen atmosphere, and then an RAFT (reversible addition-fragmentation chain transfer) polymerization reaction was performed at 95° C. for 3 hours. After the polymerization, the reaction solution was precipitated in 200 mL of methanol as an extraction solvent, filtered under reduced pressure and then dried to prepare a random copolymer. In the random copolymer (C), the content of the units derived from the monomer (A) of Preparation Example 1 was about 96.8 wt %.

Preparation Example 4. Synthesis of Random Copolymer (D)

0.520 g of the monomer (A) of Preparation Example 1, 1.456 g of pentafluorostyrene, 0.142 g of glycidyl methacrylate, 3.3 mg of AIBN (azobisisobutyronitrile) and 1.62 mL of tetrahydrofuran were placed in a 10 mL flask (Schlenk flask), and stirred at room temperature for 30 minutes under a nitrogen atmosphere, and then the polymerization reaction was performed at 60° C. for 12 hours. After the polymerization, the reaction solution was precipitated in 250 mL of methanol as an extraction solvent, filtered under reduced pressure and then dried to produce a random copolymer. The random copolymer had a number average molecular weight (Mn) and a molecular weight distribution (Mw/Mn) of 39,400 g/mol and 1.96, respectively, and the content ratio for each component in the random copolymer was 15 mol % of the monomer (A) of Preparation Example 1, 75 mol % of pentafluorostyrene and 10 mol % of glycidyl methacrylate.

Preparation Example 5. Synthesis of Block Copolymer (E)

2.0 g of the monomer (A) of Preparation Example 1, 64 mg of an RAFT (reversible addition-fragmentation chain transfer) reagent (2-cyano-2-propyl benzodithioate), 23 mg of AIBN (azobisisobutyronitrile) as a radical initiator and 5.34 mL of benzene were placed in a 10 mL Schlenk flask and stirred at room temperature for 30 minutes under a nitrogen atmosphere, and then an RAFT (reversible addition fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 82.6 wt %, and the number average molecular weight (Mn) and the molecular weight distribution (Mw/Mn) were 13,200 g/mol and 1.16, respectively. 0.3 g of the macro initiator, 2.7174 g of a pentafluorostyrene monomer and 1.306 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 115° C. for 4 hours. After the polymerization, the reaction solution was precipitated in 250 mL of methanol as an extraction solvent, and then filtered under reduced pressure and dried to prepare a pale pink block copolymer. The block copolymer is derived from the monomer (A) of Preparation Example 1, which comprises a first block having 12 chain-forming atoms (the number of carbon atoms of R in Formula A) and a second block derived from the pentafluorostyrene monomer. Here, the volume fraction of the first block was about 0.40 or so, the volume fraction of the second block was about 0.60 or so, and the number average molecular weight (Mn) and the molecular weight distribution (Mw/Mn) of the prepared block copolymer (E) 44,700 g/mol and 1.19, respectively.

Preparation Example 6. Synthesis of Polymer (F)

2.39 g of pentafluorostyrene and 30 mg of an RAFT (reversible addition-fragmentation chain transfer) reagent (2-hydroxyethyl-2-((dodecylthion)carbonothioyl)thio-2-methylpropanoate), 5 mg of AIBN (azobisisobutyronitrile) and 0.80 g of anisole were placed in a 10 mL flask (Schlenk flask), and stirred at room temperature for 30 minutes under a nitrogen atmosphere, and then an RAFT (reversible addition-fragmentation chain transfer) polymerization reaction was performed at 70° C. for 6 hours. After the polymerization, the reaction solution was precipitated in 200 mL of methanol as an extraction solvent, filtered under reduced pressure and then dried to prepare a polymer (F). The number average molecular weight (Mn) and the molecular weight distribution (Mw/Mn) of the polymer (F) were 10,000 g/mol and 1.10, respectively.

Examples 1 to 3

The random copolymer (B) of Preparation Example 2 (containing about 2.65 wt % of hMAPC1) or the random copolymer (C) of Preparation Example 3 (containing about 4.77 wt % of hMAPC1) was dissolved in fluorobenzene to a concentration of about 1.0 wt % to prepare a pinning composition. Subsequently, the pinning composition was coated on a silicon wafer (untreated base layer) to a thickness of about 30 nm and then subjected to thermal annealing at a temperature controlled as in Table 1 below (Examples 1 to 3) for 5 minutes, and then immersed in fluorobenzene for 10 minutes to remove the unreacted random copolymer (B) or unreacted random copolymer (C), thereby forming a pinning layer. Subsequently, the block copolymer (E) of Preparation Example 4 was dissolved in fluorobenzene to a concentration of about 0.8 wt % to prepare a polymer composition, which was spin-coated on the pinning layer to a thickness of about 30 nm and subjected to thermal annealing at 230° C. for about 5 minutes to form a polymer membrane. The pattern of the block copolymer (E) in the polymer membrane was confirmed by an SEM (scanning electron microscope).

Comparative Example 1

A polymer membrane was formed under the same conditions as in Example 1, except that the polymer (F) of Preparation Example 6 was used in place of the random copolymer (B) or the random copolymer (C) and the thermal annealing was conducted at a temperature controlled temperature as in Table 1 below.

The block copolymer (E) is vertically oriented on a silicon wafer, and has characteristics that on the pinning layer, horizontal orientation and vertical orientation are mixed. Thus, through whether a pattern of a block copolymer was in a shape that the horizontal orientation and the vertical orientation were mixed for a substrate, it was determined whether or not the pinning composition reacted to the silicon wafer (base layer). Specifically, it was determined by photographing the prepared polymer membrane at a magnification of 50,000 under the condition of an acceleration voltage of 2.0 kV using a scanning electron microscope (SEM) whether or not the pinning composition reacted with the base layer.

Accordingly, in Table 1 below, the case where the block copolymer (E) in the polymer membrane formed on the base layer was observed in a state that the vertically oriented and horizontally oriented structures were mixed, was indicated by O, and the case where the block copolymer (E) was observed in only the vertically oriented state was indicated by X.

TABLE 1

| | | Pinning composition | Annealing temperature (° C.) | Substrate type | Reaction with substrate |
|---|---|---|---|---|---|
| Example | 1 | Random copolymer B | 100 | Silicon wafer | O |
| | 2 | Random copolymer B | 40 | Silicon wafer | O |
| | 3 | Random copolymer C | 40 | Silicon wafer | O |

TABLE 1-continued

| | | Pinning composition | Annealing temperature (° C.) | Substrate type | Reaction with substrate |
|---|---|---|---|---|---|
| Comparative Example | 1 | Polymer F | 120 | Silicon wafer | X |

FIGS. 1 to 3 are SEM images for Examples 1 to 3, respectively. It can be confirmed from these images that in Examples 1 to 3, the lamella patterns in which the vertical and horizontal orientations are mixed are formed. Therefore, it can be seen that the pinning composition of the present application is sufficiently bonded to the base layer.

FIG. 4 is an SEM image for Comparative Example 1. It can be seen from FIG. 4 that the pinning composition to which the polymer of a different kind from the pinning composition of the present application is applied cannot sufficiently bond with the base layer when the thermal annealing is performed at a temperature of less than 130° C.

Examples 4 to 6

A neutral layer composition obtained by dissolving the random copolymer (D) of Preparation Example 4 in fluorobenzene to a concentration of about 0.5 wt % was spin-coated on a silicon wafer (base layer) and heat-treated at a temperature of 200° C. for about 5 minutes. Subsequently, it was immersed in fluorobenzene for about 1 minute to remove the residual random copolymer (D), and a substrate (neutral layer substrate) on which a pattern of a neutral layer having a thickness of about 10 nm was formed was prepared.

A pinning composition was prepared by dissolving the random copolymer (B) or the random copolymer (C) in fluorobenzene to a concentration of about 1.0 wt %. The pinning composition was spin-coated on a neutral layer substrate to a thickness of about 30 nm and then subjected to thermal annealing for about 5 minutes under the temperature conditions shown in Table 2 below (Examples 4 to 6). Thereafter, the unreacted random copolymer (B) or random copolymer (C) was removed by immersing it in fluorobenzene for 10 minutes to form a pinning layer on the neutral layer substrate. Subsequently, a polymer composition was prepared by dissolving the block copolymer (E) of Preparation Example 4 in fluorobenzene to a concentration of about 0.8 wt %, which was spin-coated on the pinning layer to a thickness of about 30 nm and subjected to thermal annealing at 230° C. for about 5 minutes to form a polymer membrane.

Through the pattern of the lamella structure of the block copolymer (E) in the polymer membrane obtained by photographing the prepared polymer membrane at a magnification of 50,000 under the condition of an acceleration voltage of 2.0 kV using a scanning electron microscope (SEM), it was confirmed whether or not the pinning composition reacted with the neutral layer on the substrate. Specifically, in Table 2 below, the case where the pinning composition reacted with the neutral layer on the substrate, so that defects were observed on the surface of the vertical lamella pattern formed by the self-assembly of the block copolymer was indicated by O. Then, in Table 2 below, the case where the pinning composition did not react with the neutral layer on the substrate, so that defects of the vertical lamella pattern formed by the self-assembly of the block copolymer were not observed was indicated by X.

TABLE 2

| | Annealing temperature (° C.) | Compound used | Reaction with neutral layer |
|---|---|---|---|
| Example 4 | 100 | Random copolymer B | X |
| Example 5 | 40 | Random copolymer B | X |
| Example 6 | 40 | Random copolymer C | X |

FIGS. 5 to 7 are SEM images for Examples 4 to 6, respectively. It can be seen from these images that defects are not observed in the pattern of the lamella structure of the block copolymer (E) in the polymer membranes of Examples 4 to 6.

According to Tables 1 and 2 above, it can be seen that even though the pinning composition of the present application is annealed at a relatively low process temperature (less than 130° C.), it can bond with the base layer and does not bond with the neutral layer. However, according to Comparative Example 1, it can be seen that the pinning composition to which the polymer different from that of the present application is applied fails to bond with the base layer when annealed at a low process temperature (less than 130° C.).

Through Examples and Comparative Example above, the pinning layer composition according to the present application can react with the base layer even in a low temperature process and cannot react with the neutral layer, whereby it can be confirmed that it is suitable for forming a vertically oriented self-assembly structure of a block copolymer having a high degree of alignment.

The invention claimed is:

1. A random copolymer comprising a unit represented by Formula 1 below and a unit represented by Formula 3-1 or 4 below:

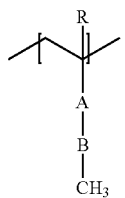

[Formula 1]

wherein, in Formula 1, R is hydrogen or an alkyl group, A is an oxygen atom, a sulfur atom, —S(=O)$_2$—, a carbonyl group, —C(=O)—X$_1$— or —X$_1$—C(=O)—, where X$_1$ is an oxygen atom or a sulfur atom, B is an alkylene group, an alkenylene group or an alkynylene group, and C is represented by Formula 2 below,

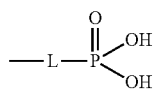

[Formula 2]

wherein, L is a single bond or an oxygen atom,

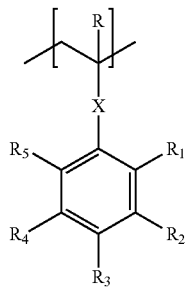

[Formula 3-1]

wherein, in Formula 3-1, R is hydrogen or an alkyl group, X is a single bond, R$_1$ to R$_5$ are each independently hydrogen, an alkyl group, a haloalkyl group or a halogen atom, and at least one halogen atom is included in at least one of R$_1$, R$_2$, R$_3$, R$_4$, or R$_5$,

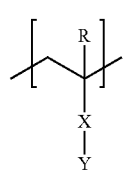

[Formula 4]

wherein, in Formula 4, R is hydrogen or an alkyl group, and X is a single bond, an oxygen atom, —S(=O)$_2$—, a carbonyl group, an alkylene group, an alkenylene group, an alkynylene group, —C(=O)—X$_1$'—, or —X$_1$'—C(=O)—, where X$_1$' is an oxygen atom, a sulfur atom, an alkylene group, an alkenylene group or an alkynylene group, and Y is a monovalent substituent including a ring structure to which a linear chain having eight or more chain-forming atoms is linked.

2. The random copolymer according to claim 1, wherein in Formula 3-1, at least one fluorine atom is included in at least one of R$_1$, R$_2$, R$_3$, R$_4$, or R$_5$.

3. The random copolymer according to claim 1, wherein in Formula 4, the ring structure of Y is an aromatic ring structure or an alicyclic ring structure.

4. The random copolymer according to claim 1, wherein the unit represented by Formula 3-1 or 4 is contained in the entire random copolymer in a ratio of 80 wt % to 99.9 wt %.

5. The random copolymer according to claim 1, which the unit represented by Formula 1 is contained in an amount of 1 part by weight to 30 parts by weight relative to 100 parts by weight of the unit represented by Formula 3-1 or 4.

6. A pinning composition comprising the random copolymer of claim 1.

7. The pinning composition according to claim 6, wherein the random copolymer is contained in a ratio of 0.1 wt % to 20 wt %.

8. A substrate comprising a base layer; and a pinning layer present on the surface of the base layer, wherein the pinning layer comprises the random copolymer of claim 1.

9. The substrate according to claim 8, wherein the pinning layer forms a stripe pattern on the surface of the base layer.

10. The substrate according to claim 8, further comprising a neutral layer present on the surface of the base layer, wherein the neutral layer and the pinning layer form alternately repeated stripe patterns.

11. The substrate according to claim 8, further comprising a polymer membrane formed on the pinning layer or the pinning layer and the neutral layer, wherein the polymer membrane comprises a block copolymer including a first block and a second block different from the first block.

12. The substrate according to claim 11, wherein the block copolymer forms a sphere, cylinder, gyroid or lamella structure.

13. The substrate according to claim 11, wherein the first block or the second block of the block copolymer comprises the unit of Formula 3 or the unit of Formula 4.

14. A method for producing a patterned substrate comprising a step of coating the pinning composition of claim 6 on a base layer and annealing it at a temperature of less than 130° C. to form a pinning layer.

15. The method for producing a patterned substrate according to claim 14, wherein a neutral layer is formed on the base layer to be annealed.

16. The method for producing a patterned substrate according to claim 14, further comprising a step of forming a polymer membrane, which comprises a block copolymer including a first block and a second block different from the first block, in a self-assembled state on the pinning layer.

17. The method for producing a patterned substrate according to claim 16, further comprising a step of selectively removing the first block or the second block of the block copolymer from the polymer membrane.

18. The substrate according to claim 10, wherein the neutral layer comprises a random copolymer including a unit represented by Formula 3 below and a unit represented by Formula 4 below:

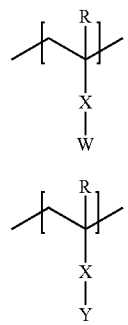

[Formula 3]

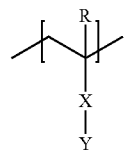

[Formula 4]

wherein, in Formula 3 and 4, R is hydrogen or an alkyl group, and X is a single bond, an oxygen atom, $-S(=O)_2-$, a carbonyl group, an alkylene group, an alkenylene group, an alkynylene group, $-C(=O)-X_1'-$, or $-X_1'-C(=O)-$, where $X_1'$ is an oxygen atom, a sulfur atom, an alkylene group, an alkenylene group or an alkynylene group, and in Formula 3, W is an aryl group containing at least one halogen atom, and in Formula 4, Y is a monovalent substituent including a ring structure to which a linear chain having eight or more chain-forming atoms is linked.

19. The substrate according to claim 18, wherein the random copolymer contained in the neutral layer comprises the unit represented by Formula 4 in a ratio of 9 mol% to 32 mol%.

20. The substrate according to claim 18, wherein the ratio (B/A) of the mole number (B) of the unit represented by Formula 3 to the mole number (A) of the unit represented by Formula 4 is in a range of 2 to 10.

* * * * *